US 11,744,053 B2

(12) United States Patent
Wang et al.

(10) Patent No.: US 11,744,053 B2
(45) Date of Patent: Aug. 29, 2023

(54) POWER INDUCTOR WITH COOLING GUIDE

(71) Applicant: FORD GLOBAL TECHNOLOGIES, LLC, Dearborn, MI (US)

(72) Inventors: Fan Wang, Novi, MI (US); Serdar Hakki Yonak, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 140 days.

(21) Appl. No.: 17/492,182

(22) Filed: Oct. 1, 2021

(65) Prior Publication Data
US 2023/0108465 A1 Apr. 6, 2023

(51) Int. Cl.
*H05K 7/20* (2006.01)
*H01F 27/12* (2006.01)

(52) U.S. Cl.
CPC ......... *H05K 7/20927* (2013.01); *H01F 27/12* (2013.01)

(58) Field of Classification Search
CPC .............................. H05K 7/20927; H01F 27/12
See application file for complete search history.

(56) References Cited

U.S. PATENT DOCUMENTS

| | | | |
|---|---|---|---|
| 3,028,566 A * | 4/1962 | Guglielmo | H01F 27/18 174/15.1 |
| 3,261,905 A | 7/1966 | Allen | |
| 5,073,734 A * | 12/1991 | Combette | H02K 41/025 310/91 |
| 7,508,289 B1 * | 3/2009 | Wernicki | H01F 27/22 336/55 |
| 9,581,234 B2 | 2/2017 | Sung et al. | |
| 2014/0175867 A1 * | 6/2014 | Sung | F16H 57/0412 307/9.1 |
| 2015/0097644 A1 * | 4/2015 | Shepard | H01F 41/0206 336/60 |
| 2016/0005521 A1 * | 1/2016 | Pal | H01F 27/2895 336/60 |
| 2019/0088399 A1 * | 3/2019 | Rippel | H01F 27/306 |
| 2020/0082968 A1 * | 3/2020 | Rippel | H01F 27/324 |
| 2021/0151236 A1 | 5/2021 | Wang et al. | |

* cited by examiner

*Primary Examiner* — Emmanuel E Duke
(74) *Attorney, Agent, or Firm* — David B Kelley; Brooks Kushman P.C.

(57) ABSTRACT

A power inductor includes a magnetic core, a conductor coiled around the core; an end cover secured to the core, a tube configured to convey fluid, and a fluid flow guide supported on the end cover. The flow guide has a receiving portion disposed under an end of the tube to receive the fluid and a distribution portion in fluid communication with the receiving portion. The distribution portion is configured to supply the fluid onto the conductor and the core and includes a plurality of guide walls.

20 Claims, 3 Drawing Sheets

POWER INDUCTOR WITH COOLING GUIDE

TECHNICAL FIELD

This disclosure relates to power inductors and more specifically to power inductors having cooling guides.

BACKGROUND

Electric vehicles may include a voltage converter (e.g., a DC-DC converter) connected between the battery and the electric machine. Electric vehicles that have alternating current (AC) electric machines also include an inverter connected between the DC-DC converter and each electric machine. A voltage converter increases ("boosts") or decreases ("bucks") the voltage potential to facilitate torque capability optimization. The DC-DC converter includes an inductor (or reactor), switches and diodes. A typical inductor includes a conductive coil that is wound around a magnetic core.

SUMMARY

According to one embodiment, a power inductor includes a magnetic core, a conductor coiled around the core; an end cover secured to the core, a tube configured to convey fluid, and a fluid flow guide supported on the end cover. The flow guide has a receiving portion disposed under an end of the tube to receive the fluid and a distribution portion in fluid communication with the receiving portion. The distribution portion is configured to supply the fluid onto the conductor and the core and includes a plurality of guide walls According to another embodiment, a power inductor includes a magnetic core, a coil wrapped around the core, an end cover secured to the core, and a trough. The trough has an upper drip tray and a bottom section configured to receive gravity-fed fluid from the drip tray and to distribute the fluid to the core and windings, wherein the bottom section includes guide walls extending from a bottom of the trough.

According to yet another embodiment, a power inductor includes a magnetic core having first and second legs interconnected by upper and lower curved portions, first and second coils around the legs, an end cover connected to at least the upper curved portion, and a trough arranged on a first side of the end cover at an angled orientation. The trough has an upper drip tray disposed above the upper curved portion and extending downwardly toward the first leg to a bottom section of the trough that is located at a lower end of the end cover. The upper drip tray is configured to receive fluid and gravity feed the fluid to the bottom section that is configured to distribute the fluid onto the first coil.

DETAILED DESCRIPTION

Figure 1:
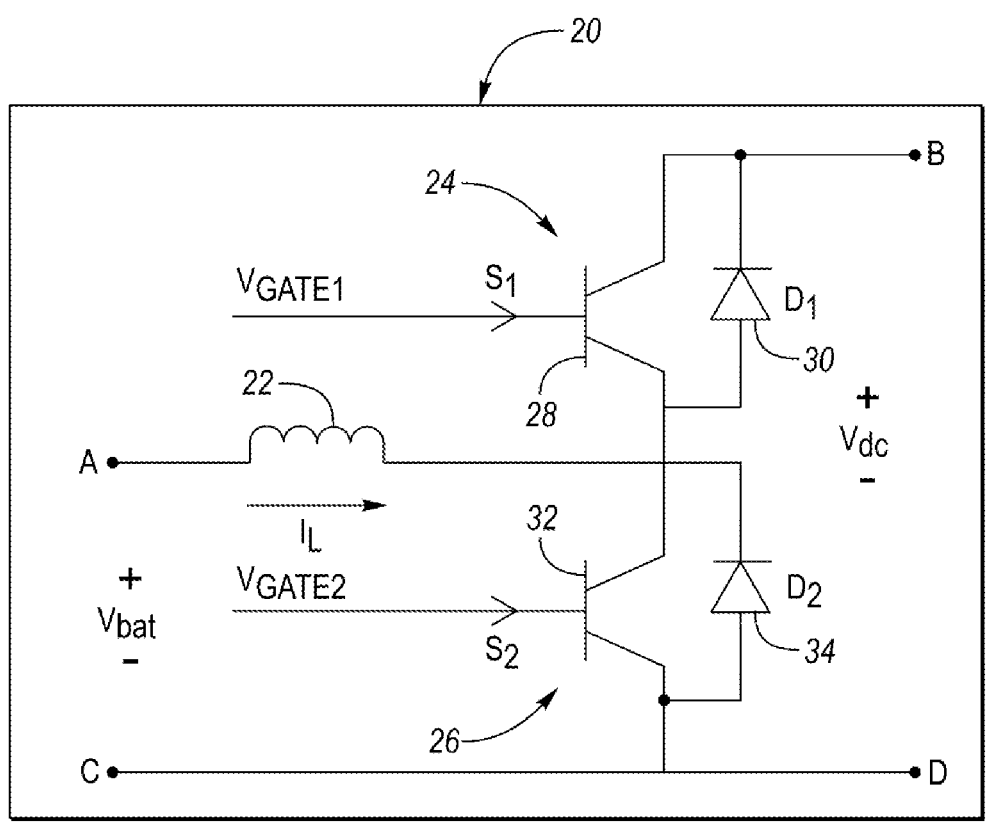
FIG. 1 is a circuit diagram of a variable-voltage converter.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Vehicles may include an electric powertrain that includes at least one traction motor for powering driven wheels. The traction motor may be powered by a traction battery. The battery is a high-voltage battery capable of outputting electrical power to operate the motor. The battery also receives electrical power from the motor when operating as a generator. A high-voltage bus electrically connects the battery to the motor. The vehicle may include one or more controllers for operating various components. The vehicle controllers generally include any number of microprocessors, ASICs, ICs, memory (e.g., FLASH, ROM, RAM, EPROM and/or EEPROM) and software code to co-act with one another to perform a series of operations. The controllers also include predetermined data, or "look-up tables" that are based on calculations and test data and stored within the memory. The controllers communicate with other vehicle systems and each other over one or more wired or wireless vehicle connections using common bus protocols (e.g., CAN and LIN).

The vehicle may include a DC-DC converter or variable voltage converter (VVC) and an inverter. The VVC and the inverter are electrically connected between the battery and the motor. The VVC may "boost" or increases the voltage potential of the electrical power provided by the battery and may "buck" or decreases the voltage potential of the electrical power provided to the battery. The inverter inverts the direct current (DC) power supplied by the battery (through the VVC) to AC power for operating the motor. The inverter also rectifies AC to DC.

The VVC is an assembly with components that may be mounted both inside and/or outside of a transmission or motor assembly of a vehicle. The VVC includes a power inductor. In one or more embodiments, the inductor is located within the transmission and/or motor housing. By mounting the inductor within a wet housing, e.g., transmission housing, the exposed surface area of the inductor may be directly cooled by transmission fluid which allows for improved thermal performance. The transmission includes additional structure for supporting the inductor while allowing the transmission fluid to flow through the structure to contact the exposed surface area.

The transmission may include a fluid, such as oil or automatic transmission fluid (ATF), for lubricating and cooling the gears located within the transmission chamber as well as any electric motors. The transmission housing is sealed to retain the fluid. The transmission may also include valves, pumps and conduits (not shown) for circulating the fluid through the cooling system. A heat exchanger or ATF cooler may be used to cool the fluid. The fluid may also be used to cool the inductor assembly 14. The transmission housing may include a sump that collects the fluid in the circulation system that is configured to draw fluid from the sump and redistribute that fluid onto components such as the inductor. As of explain below, the transmission may be configured to directly deliver transmission fluid onto the exposed windings in core of the inductor via one or more conduits. Splash cooling may also occur. Rotating elements (e.g., gears and shafts) may displace or "splash" fluid on other components.

Referring to FIG. 1, a VVC 20 includes a power inductor 22. The VVC 20 also includes a number of switches and diodes. For example, the VVC 20 includes a first switching unit 24 and a second switching unit 26 for boosting the input voltage ($V_{bat}$) to provide output voltage ($V_{dc}$). The first switching unit 24 includes a first transistor 28 connected in parallel to a first diode 30, but with their polarities switched (anti-parallel). The second switching unit 26 includes a second transistor 32 connected anti-parallel to a second diode 34. Each transistor 28, 32 may be any type of controllable switch (e.g., an insulated gate bipolar transistor (IGBT) or field-effect transistor (FET)). Additionally, each transistor 28, 32 is individually controlled by a controller. The inductor 22 is depicted as an input inductor connected in series between the battery and the switching units 24, 26. The inductor 22 generates magnetic flux when current is supplied. When the current flowing through the inductor 22 changes, a time-varying magnetic field is created, and voltage is induced. The VVC 20 may also include different circuit configurations (e.g., more than two switches).

The following figures and related text describe example power inductors according to one or more aspects of this disclosure.

Figure 2:
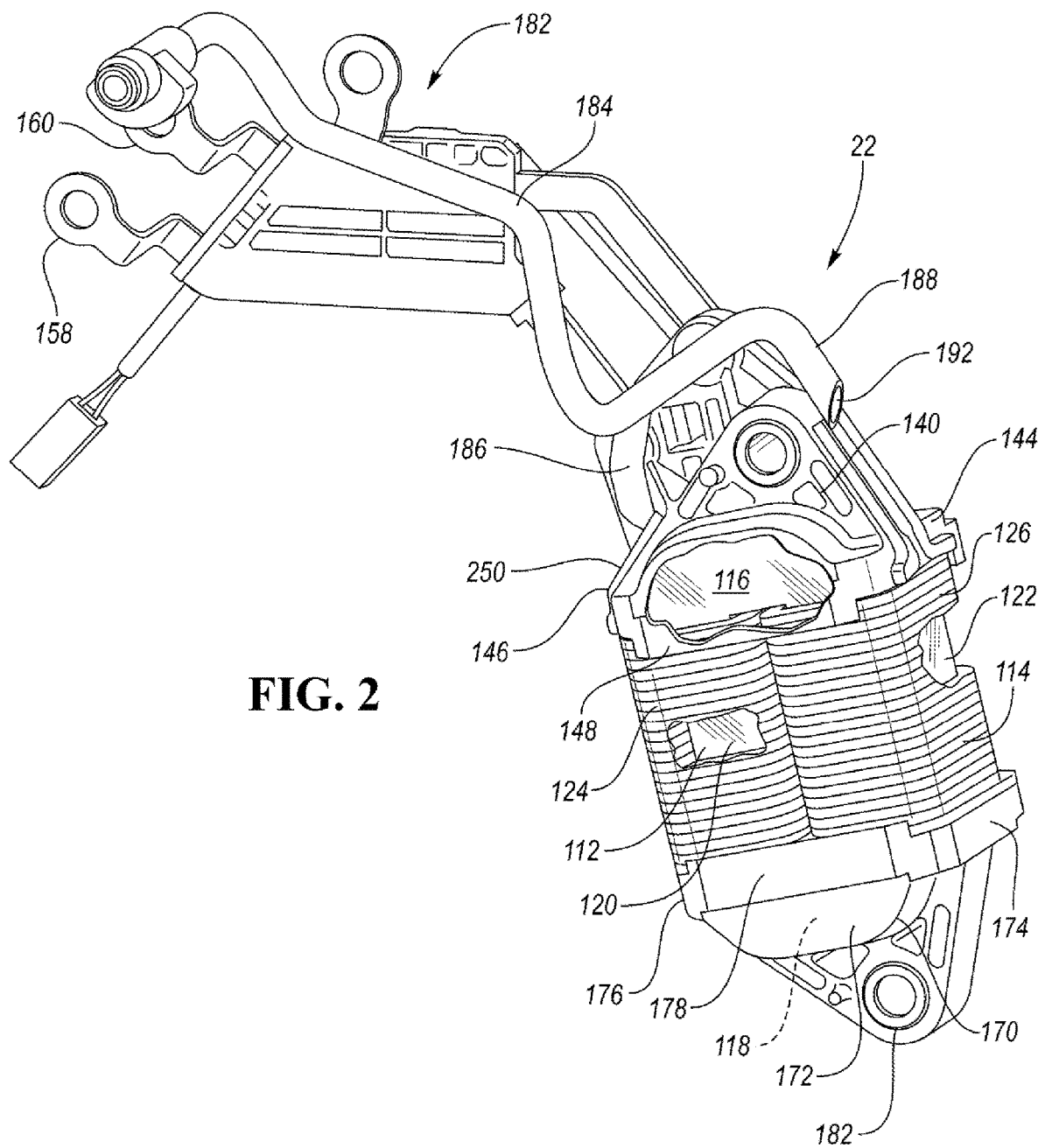
FIG. 2 is perspective view of a power inductor and cooling system.
Figure 3:
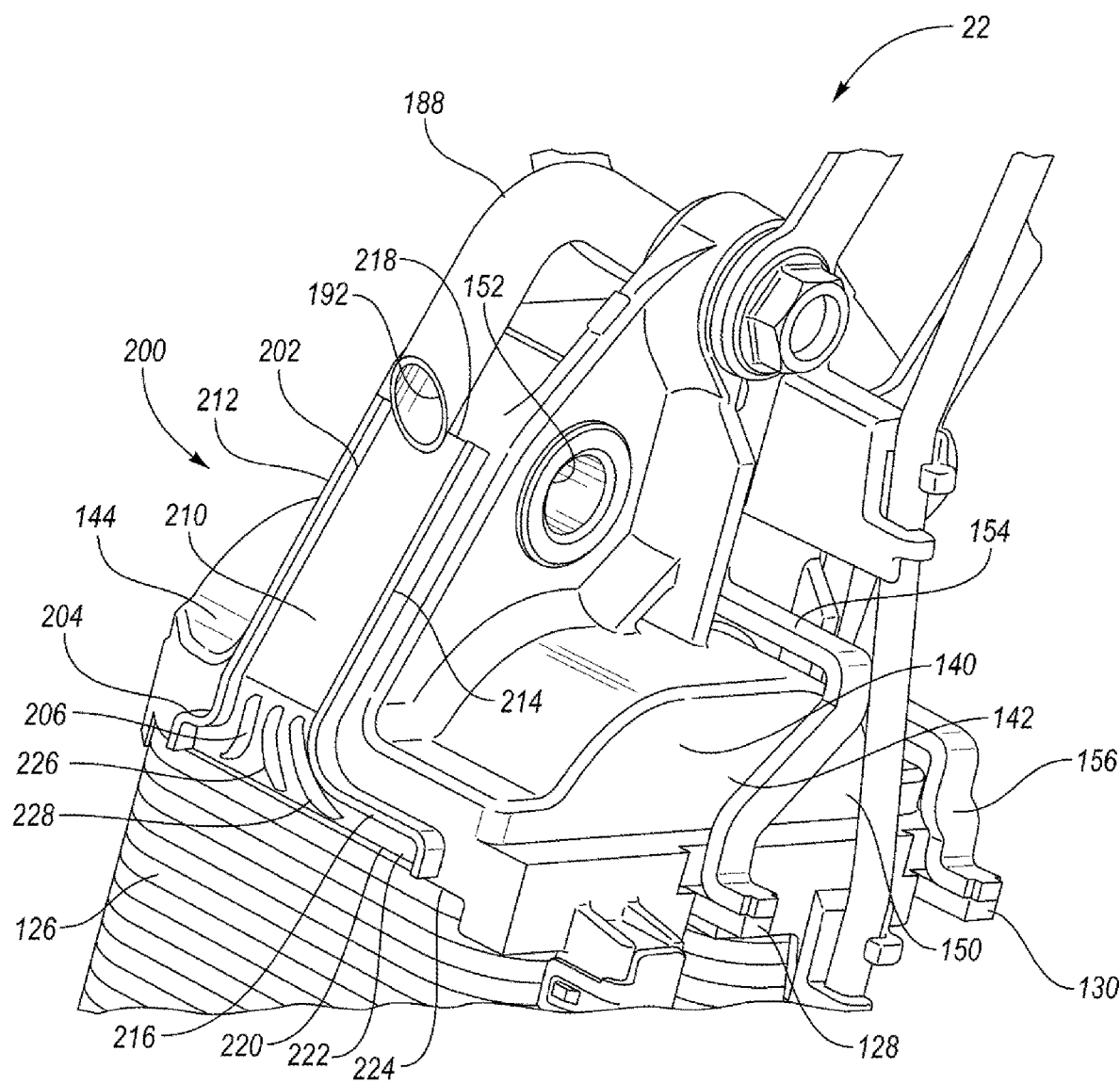
FIG. 3 is a magnified perspective view of the power inductor and the cooling system.

Referring to FIGS. 2 and 3, the power inductor 22 includes a core 112 that may be formed as a dual "C" configuration. The core may be formed of multiple segments with spacers in between. The core 112 includes an upper end 116 and a lower end 118 that are each formed in a curved shape. The core 112 also includes a first leg 120 and a second leg 122 for interconnecting the end 116 to the end 118 to collectively form a ring-shaped core 112. The core 112 may be formed of a magnetic material, such as an iron-silicon alloy powder. While not illustrated, the inductor 22 may or may not include an insulator. If provided, the insulator may be formed as a bobbin structure that separates the coils from the core.

Conductors 114 are wrapped on the core 112. For example, the conductors include two adjacent tubular coils, such as copper or aluminum, that are wound into two adjacent helical coils, a first coil 124 and a second coil 126. The coils may be formed using a rectangular (or flat) type conductive wire by an edgewise process. Input and output leads 128, 130 extend to connect to other components.

The power inductor 22 includes an upper end cover 140 that is secured onto the upper end of the core 112. The end cover 140 may be molded with the core 112 and conductor 114. The end cover 140 includes a curved portion 142 that is configured to receive the curved upper end 116 of the core 112. The end cover 140 may be substantially rectangular having opposing short sides 144 and 146 that are interconnected by opposing long sides 148 and 150. The end cover 140 may further have mounts 152 that are configured to attach with a housing of a vehicle powertrain such as within a transmission housing. The upper cover 140 may support electrical components such as busbars 154 and 156. The busbars 154, 156 electrically connect the leads 128, 130 of the windings 114 to terminals 158, 160 used to connect the power inductor 22 to the high-voltage traction battery and the VVC power electronics, for example.

The power inductor 22 further includes a lower end cover 170 that is secured onto the lower end of the core 112. The end cover 170 may be molded with the core 112 and conductor 114. The end cover 170 includes a curved portion 172 that is configured to receive the curved lower end 118 of the core 112. The end cover 170 may be substantially rectangular having opposing short sides 174 and 176 that are interconnected by opposing long sides 178. The end cover 170 may further have mounts 183 that are configured to attach with a housing or other support structure.

The power inductor 22 may be disposed within a transmission or gearbox of the vehicle. Bolts or other fastener may extend through the mounts provided in the cover 140 and 170 to attach the power inductor 22 to the housing.

The power inductor 22 may be cooled by a fluid. The fluid may be any dielectric fluid. For example, the fluid may be oil such as transmission fluid. The oil is supplied to the inductor 22 by a circulation system that includes one or more conduit 182. The conduit 182 may include a main tube 184 and first and second supply tubes 186 and 188. The supply tubes have opened ends 190, 192 that discharge oil onto the power inductor 22.

Rather than merely dripping oil onto the outer surface of the power inductor, the power inductor 22 includes one or more flow guides that each received oil from one of the supply tubes and evenly distribute that oil along the sides of the inductor 22. The flow guides use gravity to convey the fluid. That is, the oil is fed from the open ends 190, 192 and falls onto the flow guides. From there, the oil flows down the flow guides, which are angled downwardly, towards the first and second coils 124, 126. At the lower ends, the flow guides include features for evenly spreading the gravity-fed oil roughly across a width of the first and second coils. The oil then cascades down the sides of the coils to facilitate cooling. The oil then drips from the bottom of the power inductor and is collected in the sump of the housing.

In one or more embodiments, the flow guide is a trough 200 supported on the upper end 140. The trough 200 has an open top. The trough 200 maybe integrally formed with the end cover 140 or may be a separate component that is attached thereon. The trough 200 may have an upper drip tray 202 (receiving portion) and a bottom section 204 (distribution portion). The drip tray 202 is arranged under the supply tube 188 so that oil exiting the open end 192 falls onto the drip tray 202. The drip tray 202 catches the oil and is angled downwardly to channel the oil towards the bottom section 204. The bottom section 204 is configured to receive gravity-feed oil from the drip tray 202 and to distribute the oil to the core 112 and the coil 126. In order to increase the surface area of the coil that receives oil, the bottom section 204 is wider than the drip tray 202. The bottom section 204 includes guide walls 206 configured to spread the oil across the width of the bottom section 204. The guide walls 206 may be arcuate walls. The guide walls 206 are configured to receive oil from the narrower drip tray 202 and redirect that oil laterally. To facilitate this, at least some of the guide walls 206 curve in opposite directions. In the illustrated embodiment, for example, the drip tray 202 is offset relative to the bottom section 204. To evenly spread the oil across the bottom section 204, a single guide wall is curved to direct oil to the short side and a pair of guide walls are curved to direct oil to the wide side. This, of course, is just one example.

The trough 200 includes a bottom 210 and opposing lateral sidewalls 212 and 214 that extend upwardly from the bottom 210. The bottom 210 is angled relative to the ground so that gravity feeds oil through the trough 200. The bottom 210 may have a first angle throughout the drip tray 202 and a second, steeper angle at the bottom section 204. The sidewalls 212 and 214 cooperate to retain the oil within the trough 200. The sidewalls of the drip tray 202 and the bottom section 204 may be continuous, i.e., share common walls. The width between the lateral sidewalls 212, 214 is narrower at the drip tray 202 than at the bottom section 204. As shown in the illustrated embodiment, the sidewalls 212 and 214 curve outwardly to have horizontally extending portions 216 along the top of the bottom section 204. The sidewalls 212, 214 then curve again in the vertical direction. The upper and lower ends 218, 220 of the trough 200 may be open, that is, do not have a sidewall. At the lower end 220, the sidewalls 212, 214 terminate at the edge 222 of the bottom lower end 220. This allows the oil to exit the trough 200 onto the coil 126.

The trough 200 may be arranged on the upper end cover 140 such that the bottom edge 222 is adjacent to a lower end 224 of the end cover 140. As shown in the illustrated embodiment, the bottom edge 222 may be spaced slightly up from the lower end 224. In other embodiments, the trough 200 may slightly overhang the lower end 224.

The guide walls 206 extend upwardly from the bottom 210 to interact with oil flowing through the trough 200. Each of the guide walls may include an upper end 226 that is located either within the oil drip tray 202 or within a neck of the bottom section 204. From there, the guide walls 206 extend downwardly, in a curved manner, to a lower end 228 that is located near the bottom edge 222. As discussed above, the walls 206 distribute the received oil in the width direction to provide better coverage of the fluid on the coils.

A second flow guide, e.g., trough 250, may be provided on the other side of the end 140. The second trough 250 is arranged to receive oil from the supply tube 186 And to supply the oil to the coil 124 wrapped around the leg 120. The second trough 250 may have the same main components as the first trough 200, but may be in different proportions to match the shape of the end cover on that side. For example, as shown in the illustrated embodiment, the end cover 140 is not symmetrical. As such, the oil drip tray and/or the bottom section of the second trough 250 may have a different shape or dimension to match that side of the end cover. However, the principle of operation remains the same. The bottom section of the second trough 250 is enlarged in order to provide increased coverage of the oil onto the coil 124. The second trough 250 may also include guide walls as discussed above. The shape and the number of the guide walls of the second trough 250 may be different than the first trough 200 to account for the shape of that side of the end 140. In some embodiments, the trough 250 may be the same as trough 200.

While the illustrated power inductor 22 includes flow guides on both sides of the inductor, only one flow guide may be used in other embodiments. For example, another power inverter may only include the trough 200 or the trough 250 depending upon the cooling needs of the power inductor as well as the design of the housing in which it resides.

The above-described embodiments increase the surface area of the inductor that receives oil. This may improve the cooling efficiency of the inductor allowing for increased current capability of the inductor.

While exemplary embodiments are described above, it is not intended that these embodiments describe all possible forms encompassed by the claims. The words used in the specification are words of description rather than limitation, and it is understood that various changes can be made without departing from the spirit and scope of the disclosure.

As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A power inductor comprising:
   a magnetic core;
   a conductor coiled around the core;
   an end cover secured to the core;
   a tube configured to convey fluid; and
   a fluid flow guide supported on the end cover, the flow guide including a receiving portion disposed under an end of the tube to receive the fluid and a distribution portion in fluid communication with the receiving portion, wherein the distribution portion is configured to supply the fluid onto the conductor and the core and includes a plurality of guide walls.

2. The power inductor of claim 1, wherein at least one of the guide walls is arcuate.

3. The power inductor of claim 1, wherein the flow guide is a trough having a bottom, an open top, and sidewalls.

4. The power inductor of claim 3, wherein the distribution portion is wider than the receiving portion.

5. The power inductor of claim 3, wherein the sidewalls terminate at an open end of the distribution portion.

6. The power inductor of claim 1, wherein the distribution portion is wider than the receiving portion.

7. The power inductor of claim 1, wherein the end cover and the flow guide are integrally formed.

8. The power inductor of claim 1, wherein the distribution portion has opposing first and second lateral sides, and wherein one of the guide walls curves towards the first lateral side and another of the guide walls curves towards the second lateral side.

9. The power inductor of claim 1, wherein the core includes a first leg and a second leg, and wherein the flow guide is two flow guides, a first associated with the first leg and a second associated with the second leg.

10. A power inductor comprising:
    a magnetic core;
    a coil wrapped around the core;
    an end cover secured to the core; and
    a trough including an upper drip tray and a bottom section configured to receive gravity-fed fluid from the drip tray and to distribute the fluid to the core and windings, wherein the bottom section includes guide walls extending from a bottom of the trough.

11. The power inductor of claim 10, wherein at least one of the guide walls is arcuate.

12. The power inductor of claim 10, wherein all of the guide walls are arcuate.

13. The power inductor of claim 10, wherein the bottom section has opposing first and second lateral sides, and wherein one of the guide walls curves towards the first lateral side and another of the guide wall curves towards the second lateral side.

14. The power inductor of claim 10, wherein the bottom section is wider than the drip tray.

15. The power inductor of claim 10, wherein the trough is attached to an outer surface of the end cover.

16. The power inductor of claim 10, wherein the trough is integrally formed with the end cover.

17. A power inductor comprising:
- a magnetic core having first and second legs interconnected by upper and lower curved portions;
- first and second coils around the legs;
- an end cover connected to at least the upper curved portion; and
- a trough arranged on a first side of the end cover at an angled orientation, the trough including an upper drip tray disposed above the upper curved portion and extending downwardly toward the first leg to a bottom section of the trough that is located at a lower end of the end cover, wherein the upper drip tray is configured to receive fluid and gravity feed the fluid to the bottom section that is configured to distribute the fluid onto the first coil.

18. The power inductor of claim 17, wherein the bottom section includes guide walls.

19. The power inductor of claim 17 further comprising a second trough arranged on a second side of the end cover at an angled orientation, the second trough including an upper drip tray disposed above the upper curved portion and extending downwardly toward the second leg to a bottom section of the second trough that is located at the lower end of the end cover, wherein the upper drip tray of the second trough is configured to receive fluid and gravity feed the fluid to the bottom section of the second trough that is configured to distribute the fluid onto the second coil.

20. The power inductor of claim 17, wherein the bottom section is wider than the drip tray.

\* \* \* \* \*